United States Patent
Prost et al.

(10) Patent No.: US 12,098,744 B2
(45) Date of Patent: Sep. 24, 2024

(54) GUIDING MEMBER, MECHANICAL SYSTEM COMPRISING SUCH A GUIDING MEMBER, AND METHOD FOR PRODUCING SUCH A GUIDING MEMBER

(71) Applicant: HYDROMECANIQUE ET FROTTEMENT, Andrezieux-Boutheon (FR)

(72) Inventors: Fabrice Prost, Saint-Etienne (FR); Pierrick Pavallier, Perreux (FR)

(73) Assignee: HYDROMECANIQUE ET FROTTEMENT (FR)

( * ) Notice: Subject to any disclaimer, the term of this patent is extended or adjusted under 35 U.S.C. 154(b) by 358 days.

(21) Appl. No.: 17/613,257

(22) PCT Filed: May 15, 2020

(86) PCT No.: PCT/FR2020/050810
§ 371 (c)(1),
(2) Date: Nov. 22, 2021

(87) PCT Pub. No.: WO2020/234531
PCT Pub. Date: Nov. 26, 2020

(65) Prior Publication Data
US 2022/0220999 A1     Jul. 14, 2022

(30) Foreign Application Priority Data
May 22, 2019   (FR) ..................................... 1905390

(51) Int. Cl.
*F16C 11/04* (2006.01)
*B32B 1/08* (2006.01)
(Continued)

(52) U.S. Cl.
CPC ................ *F16C 11/04* (2013.01); *B32B 1/08* (2013.01); *B32B 15/00* (2013.01); *B32B 15/01* (2013.01);
(Continued)

(58) Field of Classification Search
CPC .. F16B 1/00; F16C 11/04; F16C 31/02; F16C 33/12; F16C 33/208; F16C 2223/14;
(Continued)

(56) References Cited

U.S. PATENT DOCUMENTS 6,241,393 B1    6/2001    Georges et al.
7,998,238 B2 *  8/2011    Takayama ............ F16J 15/3496
                                                       277/653

(Continued)

FOREIGN PATENT DOCUMENTS

EP    0987456       3/2000
GB    2446245 A     8/2008
(Continued)

*Primary Examiner* — Michael E. La Villa
(74) *Attorney, Agent, or Firm* — Forge IP, PLLC

(57) ABSTRACT

A guiding member, having a body provided with a bore for mounting a mobile element is presented. The body consists of a metallic material. The bore has a surface layer treated against jamming over a diffusion depth of less than or equal to 0.6 mm. The surface layer has a hardness of greater than or equal to 500 Hv1 over a depth of between 5 and 50 μm.

10 Claims, 1 Drawing Sheet

(51) Int. Cl.
| | |
|---|---|
| B32B 15/00 | (2006.01) |
| B32B 15/01 | (2006.01) |
| B32B 15/04 | (2006.01) |
| B32B 15/18 | (2006.01) |
| C23C 8/00 | (2006.01) |
| C23C 8/02 | (2006.01) |
| C23C 8/04 | (2006.01) |
| C23C 8/06 | (2006.01) |
| C23C 8/18 | (2006.01) |
| C23C 8/22 | (2006.01) |
| C23C 8/26 | (2006.01) |
| C23C 8/32 | (2006.01) |
| C23C 8/38 | (2006.01) |
| C23C 8/50 | (2006.01) |
| C23C 8/56 | (2006.01) |
| C23C 8/66 | (2006.01) |
| C23C 8/70 | (2006.01) |
| C23C 8/76 | (2006.01) |
| C23C 8/80 | (2006.01) |
| C23C 14/06 | (2006.01) |
| C23C 14/22 | (2006.01) |
| C23C 14/48 | (2006.01) |
| C23C 14/58 | (2006.01) |
| C23C 30/00 | (2006.01) |
| F16B 1/00 | (2006.01) |
| F16C 31/02 | (2006.01) |
| F16C 33/12 | (2006.01) |
| F16C 33/20 | (2006.01) |
| C21D 1/06 | (2006.01) |
| C21D 1/74 | (2006.01) |
| C21D 9/40 | (2006.01) |

(52) U.S. Cl.
CPC ............ *B32B 15/011* (2013.01); *B32B 15/04* (2013.01); *B32B 15/043* (2013.01); *B32B 15/18* (2013.01); *C23C 8/00* (2013.01); *C23C 8/02* (2013.01); *C23C 8/04* (2013.01); *C23C 8/06* (2013.01); *C23C 8/18* (2013.01); *C23C 8/22* (2013.01); *C23C 8/26* (2013.01); *C23C 8/32* (2013.01); *C23C 8/38* (2013.01); *C23C 8/50* (2013.01); *C23C 8/56* (2013.01); *C23C 8/66* (2013.01); *C23C 8/70* (2013.01); *C23C 8/76* (2013.01); *C23C 8/80* (2013.01); *C23C 14/06* (2013.01); *C23C 14/0641* (2013.01); *C23C 14/0658* (2013.01); *C23C 14/0664* (2013.01); *C23C 14/067* (2013.01); *C23C 14/221* (2013.01); *C23C 14/48* (2013.01); *C23C 14/58* (2013.01); *C23C 14/5813* (2013.01); *C23C 14/5833* (2013.01); *C23C 14/584* (2013.01); *C23C 14/586* (2013.01); *C23C 30/00* (2013.01); *C23C 30/005* (2013.01); *F16B 1/00* (2013.01); *F16C 31/02* (2013.01); *F16C 33/12* (2013.01); *F16C 33/208* (2013.01); *C21D 1/06* (2013.01); *C21D 1/74* (2013.01); *C21D 9/40* (2013.01); *C21D 2221/00* (2013.01); *C21D 2261/00* (2013.01); *F16C 2202/04* (2013.01); *F16C 2202/06* (2013.01); *F16C 2202/08* (2013.01); *F16C 2204/60* (2013.01); *F16C 2223/10* (2013.01); *F16C 2223/14* (2013.01); *F16C 2223/16* (2013.01); *F16C 2240/60* (2013.01); *F16C 2310/00* (2013.01); *F16C 2352/00* (2013.01); *Y10T 428/12292* (2015.01); *Y10T 428/12458* (2015.01); *Y10T 428/12576* (2015.01); *Y10T 428/12583* (2015.01); *Y10T 428/12611* (2015.01); *Y10T 428/12958* (2015.01); *Y10T 428/12972* (2015.01); *Y10T 428/12993* (2015.01); *Y10T 428/13* (2015.01); *Y10T 428/24942* (2015.01); *Y10T 428/2495* (2015.01); *Y10T 428/24967* (2015.01); *Y10T 428/24983* (2015.01); *Y10T 428/26* (2015.01); *Y10T 428/263* (2015.01); *Y10T 428/264* (2015.01); *Y10T 428/265* (2015.01)

(58) Field of Classification Search
CPC .............. F16C 2223/16; F16C 2202/04; F16C 2202/06; F16C 2202/08; F16C 2204/60; F16C 2240/60; F16C 2310/00; F16C 2352/00; C23C 8/00; C23C 8/26; C23C 8/32; C23C 8/80; C23C 8/02; C23C 8/22; C23C 8/18; C23C 8/06; C23C 8/04; C23C 8/38; C23C 8/50; C23C 8/56; C23C 8/66; C23C 8/70; C23C 8/76; C23C 14/06; C23C 14/0641; C23C 14/0658; C23C 14/0664; C23C 14/067; C23C 14/221; C23C 14/48; C23C 14/58; C23C 14/5833; C23C 14/584; C23C 14/586; C23C 14/5813; C23C 30/00; C23C 30/005; C21D 1/06; C21D 1/74; C21D 9/40; C21D 2221/00; C21D 2261/00; Y10T 428/122292; Y10T 428/12576; Y10T 428/12583; Y10T 428/12611; Y10T 428/12958; Y10T 428/12972; Y10T 428/12993; Y10T 428/13; Y10T 428/24942; Y10T 428/2495; Y10T 428/24967; Y10T 428/24983; Y10T 428/263; Y10T 428/264; Y10T 428/265; Y10T 428/26; Y10T 428/12458; B32B 1/08; B32B 15/00; B32B 15/01; B32B 15/04; B32B 15/043; B32B 15/011; B32B 15/18
See application file for complete search history.

(56) References Cited

U.S. PATENT DOCUMENTS

2009/0056835 A1* 3/2009 Chaduiron ............. C22C 38/04
148/318
2022/0260115 A1* 8/2022 Prost ...................... F16C 33/12

FOREIGN PATENT DOCUMENTS

| WO | WO2006087498 A1 | 8/2006 |
| WO | WO2006111661 A1 | 10/2006 |
| WO | WO-2017007397 A1 * | 1/2017 |

* cited by examiner

GUIDING MEMBER, MECHANICAL SYSTEM COMPRISING SUCH A GUIDING MEMBER, AND METHOD FOR PRODUCING SUCH A GUIDING MEMBER

TECHNICAL FIELD

The present invention relates to a guiding member, a mechanical system comprising such a guiding member, and a method for producing such a guiding member.

The field of the invention is that of mechanical systems operating in oscillation, translation or rotation under high loads and subjected to impacts in an abrasive environment.

PRIOR ART

Conventionally, such a system comprises a guiding member and a mobile element, as described in document WO 2006087498.

By way of example, the system can form a joint for a public work or mining machine, of an agricultural vehicle, of an industrial machine, etc.

The rings made of bronze, of composite material or of polymer material have the advantage, when they are subjected to high loads, of being able to accommodate to the geometry of the shaft and thus to reduce normal pressures. The reduction of the factor p.V (product of the diametral pressure p in $N/mm^2$ and the circumferential speed V in m/s) then leads to a reduction in the wear of the ring.

However, their low surface hardness results in a low resistance to abrasive wear.

As a result, for applications subjected to high loads and to high abrasion, it is customary to use steels with high mechanical properties (Re>800 MPa) and high hardnesses. These steels are heat-treated and have a bainitic or martensitic structure.

However, because of their significant mechanical properties, these rings cannot accommodate bending of axes. This leads to very high localised p.V factors, and therefore to wear and then to jamming.

DESCRIPTION OF THE INVENTION

The aim of the present invention is to propose an improved guiding member which overcomes the above disadvantages.

To this end, the invention relates to a guiding member, comprising a body provided with a bore for mounting a mobile element, the body being made of a metallic material, characterised in that the bore has a surface layer treated against jamming over a diffusion depth of less than or equal to 0.6 mm, the surface layer having a hardness of greater than or equal to 500 Hv1 over a depth of between 5 and 50 µm.

Thus, the invention makes it possible to obtain a high performance guiding member in the scope of applications under high loads and impacts in an abrasive environment, with an excellent compromise between resistance to jamming, abrasion resistance and accommodation. The guiding member has high performances, usually obtained with much more expensive categories of steels, as well as longer and deeper surface treatments. The proposed solution is more competitive, with an improved performance/price ratio.

According to other advantageous characteristics of the invention, taken individually or in combination:

The metallic material is a ferrous metal material.

The metallic material is selected from structural steels or low alloy steels.

The metallic material of the body has a yield strength Re of between 200 and 600 MPa.

The metallic material has a yield strength Re of between 300 and 600 MPa.

The metallic material has a yield strength Re of between 400 and 500 MPa.

The surface layer is treated against jamming over a diffusion depth less than or equal to 0.3 mm.

The surface layer has a hardness greater than or equal to 500 Hv1 over a depth of between 25 and 50 µm.

The surface layer has a hardness greater than or equal to 550 Hv1 over a depth of between 5 and 50 µm.

The surface layer has a hardness greater than or equal to 550 Hv1 over a depth of between 25 and 50 µm.

The invention also relates to a mechanical system, comprising a guiding member, and a mobile element arranged in the bore of this guiding member.

The invention also relates to a method for producing a guiding member such as described above, said guiding member comprising a body provided with a bore for mounting a mobile element, the method being characterised in that it comprises the following successive steps:

producing the body from a metallic material;

carrying out a surface treatment of the bore in order to protect the guiding member against jamming, the surface treatment affecting a surface layer of the bore over a diffusion depth less than or equal to 0.6 mm, the surface layer having, after the surface treatment, a hardness greater than or equal to 550 Hv1 over a depth of between 5 and 50 µm.

BRIEF DESCRIPTION OF THE DRAWINGS

The invention will be better understood from the following description which is given solely by way of non-limiting example and is made with reference to the appended drawings, wherein.

DETAILED DESCRIPTION OF THE INVENTION

Figure 1:
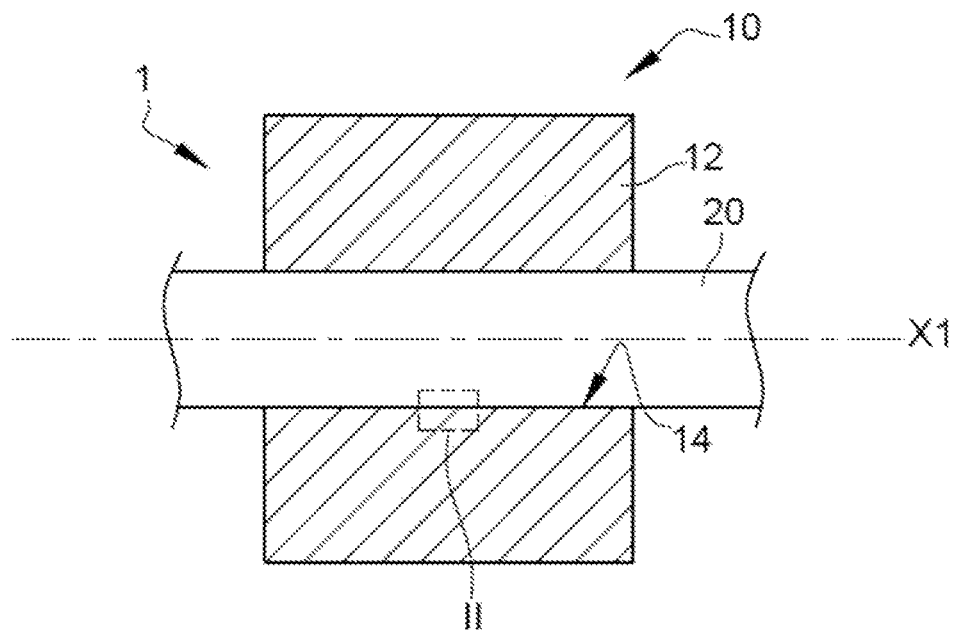
FIG. 1 is a longitudinal cross-section of a mechanised system according to the invention, comprising a guiding member according to the invention, and a mobile element.
Figure 2:
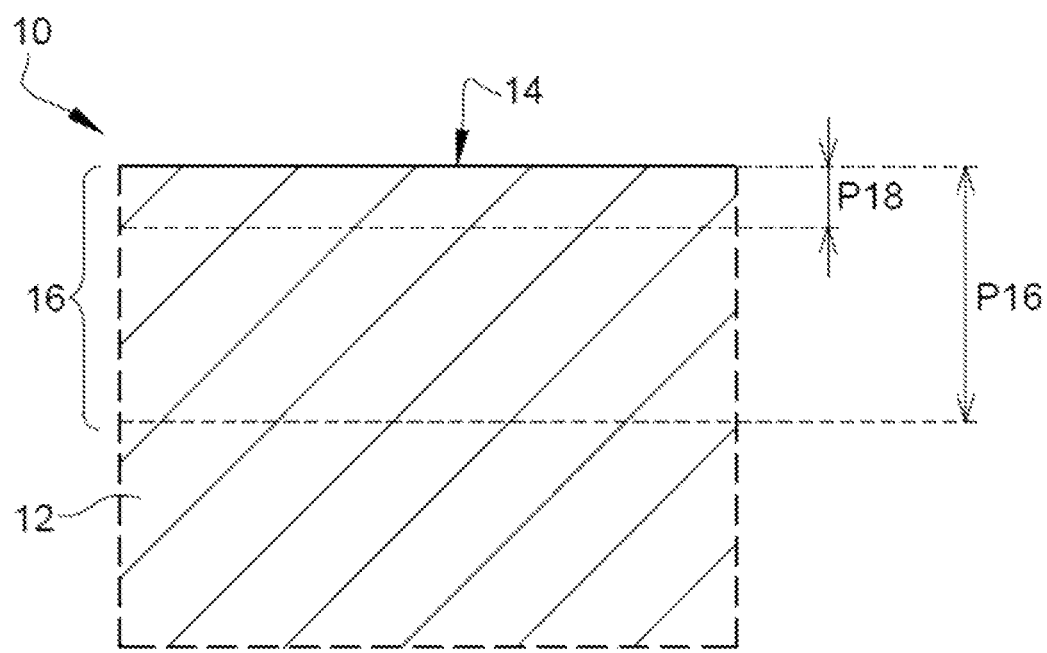
FIG. 2 is an enlarged view of detail II in FIG. 1.

FIGS. 1 and 2 show a mechanical system 1 according to the invention, comprising a ring 10 according to the invention, and a shaft 20 arranged in the ring 10 along a longitudinal axis X1.

The system 1 is designed to withstand high loads and/or impacts in an abrasive environment. The system 1 constitutes, for example, a joint for a public work or mining machine, an agricultural vehicle, an industrial machine for the steel industry, etc.

The ring 10 comprises a body 12 and a bore 14 with a cylindrical profile formed in the body 12. The bore 14 is provided to receive the shaft 20, mobile in rotation about the axis X1 and/or in translation along the axis X1, according to a continuous or reciprocating movement. The ring 10 constitutes a member for guiding the shaft 20 in rotation and/or translation.

The friction interface between the ring 10 and the shaft 20, more specifically between the bore 14 and the outer surface of the shaft 20, is preferably lubricated. The bore 14 can be smooth or comprise cavities acting as a lubricant reserve, as described in documents EP 0987456 and WO 2006087498.

The body 12 is made of a metallic material having a yield strength Re of between 200 and 600 M Pa. Advantageously, the metallic material can be chosen from structural steels or low-alloy steels (comprising at least 95% of iron and carbon). This greatly reduces the cost of producing the ring 10, while providing several advantages, detailed below. The metallic material has a yield strength Re preferably of between 300 and 600 MPa and even more preferably of between 400 and 500 MPa.

By way of non-limiting examples, the material of the body 12 can be chosen from the following metallic materials:

TABLE 1

| Standardised shade | Tensile yield strength Re (in PMa) | Category |
|---|---|---|
| S235 | 235 | Steel for general use |
| S335 | 335 | Steel for general use |
| E295 | 295 | Machine construction steel |
| S355 | 355 | Machine construction steel |
| 34CrMo4 | 450 to 600 | Low-alloy steel |

According to the invention, the bore 14 has a surface layer 16 treated against jamming over a diffusion depth P16 of less than or equal to 0.3 mm. The surface layer 16 has a hardness of greater than or equal to 500 Hv1 over a depth P18 of between 10 and 50 µm. The hardness can be between 500 and 650 Hv1, being preferably greater than 550 Hv1. The depth P18 is preferably between 20 µm and 50 µm. For example, the diffusion depth P16 of the anti-jamming surface treatment applied to the bore 14 can be 0.2 mm, with a hardness equal to 600 Hv1 over a depth P18 of 30 µm. The depths P16 and P18 are not to scale in FIG. 2 with a view to simplification.

Preferably, the anti-jamming treatment is nitriding.

If the hardened depth P18 is too low (<10 µm), the wear endurance is too low. If the depth P18 is too great (>50 µm), the surface layer 16 becomes fragile and less resilient, and therefore subject to flaking, and has a smaller capacity for accommodation.

The diffusion depth P16 of the anti-jamming surface treatment is limited to 0.3 mm in order to preserve the properties of maximum accommodation. The surface treatment will thus have the advantage of not flaking when it is subjected to compressions of at least 4%.

Preferably, the surface layer 16 has a hardness greater than or equal to 500 Hv1, more preferably greater than or equal to 550 Hv1, over a depth P18 of between 25 and 50 µm. A depth of at least 25 µm makes it possible to further increase the service life of the guiding member, by increasing the wear endurance.

According to a particular embodiment, the surface layer 16 treated against jamming comprises a combination layer (also called the white layer) at depth P18, and a diffusion layer at depth P16.

Preferably, the surface layer 16 treated against jamming also comprises an intermediate layer, located between the combination layer and the diffusion layer.

The intermediate layer is preferably located at a depth of between 20 and 50 µm, and more preferably between 25 and 50 µm. A depth P18 of at least 25 µm extends the service life of the intermediate layer, and therefore that of the guiding element as well, by increasing the wear resistance. A depth of 50 µm or less increases the resilience of the intermediate layer, and thus that of the guiding element, improves the accommodation capacity, and limits flaking.

The intermediate layer has a hardness greater than or equal to 500 Hv1, preferably greater than or equal to 550 Hv1, over a depth P18 of between 20 and 50 µm, preferably between 25 and 50 µm.

The intermediate layer is formed during the treatment against jamming, in particular by nitriding or carbonitriding, when said treatment is carried out at high temperature, i.e. a temperature greater than or equal to 592° C.

The temperature of 592° C. delimits the ferritic phase of the austenitic phase in the iron-nitrogen diagram. Above 592° C., a γN phase (nitrogen-enriched austenite) is formed, which corresponds to the intermediate layer described above.

Following a post-treatment of the bore 14, it is possible to check the hardness of the intermediate layer. With a high temperature post-treatment, it is possible to obtain an intermediate layer of high hardness, while with a lower temperature treatment, it is possible to obtain an intermediate layer of lower hardness. Examples of post-treatment which could be used are oxidation, for example by baths of molten salts between 350° C. and 500° C., gas oxidation between 350° C. and 500° C., or oxidation in a brine at boiling point between 120° C. and 160° C.

As the metallic materials collapse when they are subjected to loads above their yield strengths, once the accommodation has been carried out, the load resistance of the mechanically stressed zones will be greater.

Compared with rings made of metallic materials having significant mechanical properties (Re>600 MPa), the use of a ring 10 made of metallic material having less significant mechanical properties (Re<600 MPa) makes it possible to reduce the normal pressure at the interface between the ring 10 and the shaft 20 by accommodating their facing surfaces, and therefore to reduce the factor p.V, and therefore to reduce wear within the mechanical system 1.

The surface treatment follows the accommodation of the material and provides a high surface hardness, making it possible to have a good abrasion resistance and a jamming resistance.

Unexpectedly, the mechanical system 1 is finally more efficient with the ring 10 according to the invention made of material Re<600 MPa than with a ring made of material Re>MPa.

Compared with the rings made of composite materials and polymer materials, the ring 10 has better load resistance following work hardening of the surface layer, and better abrasion resistance due to the surface hardness of the surface layer 16 subjected to the surface treatment.

Compared with the bronze (125<Re<175 MPa), brass (Re≈180 MPa) and cupro-aluminium rings, the ring 10 has a better abrasion resistance.

Compared with the rings made of steel hardened in the mass or superficially (high-frequency induction soaking, cementation), the ring 10 has better resistance to jamming and better capacity to accommodate the load.

Compared with the rings having a hard anti-jamming coating applied in the bore (thermal spraying, PVD, chemical Ni, hard Cr, etc.), requiring a material having significant mechanical properties (Re>600 MPa) in order to avoid flaking of the coating subjected to abrasion and to impacts, the ring 10 may be made of a metallic material having less significant mechanical properties (Re<600 MPa), which provides the various advantages presented above.

A comparative test is carried out using two mechanical systems, comprising a ring and a shaft that can rotate in the ring for 1000 hours.

When the ring is made of steel with Re>600 MPa, the accommodation is insufficient, the loads are poorly distributed, the factor p.V is high at the locations where the loads are maximum, leading to significant wear of the shaft.

When the ring 10 is in accordance with the invention, with Re<600 MPa and anti-jamming surface treatment, the accommodation is satisfactory, the loads are better distributed, the factor p.V is limited, and it can be seen that the wear of the shaft 20 is much less than in the case above.

It is sought to characterise the ring 10 more specifically by making a cross-section of the body 12 in a radial plane. This makes it possible to show the work hardening of the ring 10 and an increase in its mechanical characteristics. The body 12 has undergone a deformation of 3%, i.e. the diameter of the bore 14 has increased by 3%. The hardness of the body 12, measured at 0.6 mm from the surface of the deformed bore 14, goes to 295 Hv0.1 against 265 Hv0.1 before the test, i.e. a tensile yield strength Re going from 850 MPa to 950 MPa.

Moreover, the mechanical system 1 may be shaped differently from FIGS. 1 and 2 without moving away from the scope of the invention.

In a variant that is not shown, the system 1 can comprise a guiding member 10 that is different from a ring.

According to another variant (not shown), the system 1 can comprise an element 20 different from a shaft, this element 20 being mobile in the member 10 in rotation about the axis X1 and/or in translation along the axis X1.

According to another variant (not shown), the member 10 can comprise several bores 14 having a surface layer 16 according to the invention.

Furthermore, the technical characteristics of the various embodiments and variants mentioned above can be combined in their entirety or only in part. Thus, the mechanical system 1 and the guiding member 10 can be adapted in terms of cost, functionalities and performance.

The invention claimed is:

1. A guiding member, comprising a body provided with a bore for mounting a mobile element, the body being made of a ferrous metallic material having a yield strength Re of between 200 and 600 MPa, characterised in that the bore has a surface layer treated against jamming over a diffusion depth less than or equal to 0.6 mm, the surface layer having a hardness greater than or equal to 500 Hv1 from a surface to a depth of between 5 and 50 µm.

2. The guiding member according to claim 1, characterised in that the metallic material is chosen from structural steels or low-alloy steels.

3. The guiding member according to claim 1, characterised in that the metallic material has a yield strength Re of between 300 and 600 MPa.

4. The guiding member according to claim 1, characterised in that the metallic material has a yield strength Re of between 400 and 500 MPa.

5. The guiding member according to claim 1, characterised in that the surface layer is treated against jamming over a diffusion depth of less than or equal to 0.3 mm.

6. The guiding member according to claim 1, characterised in that the surface layer has a hardness greater than or equal to 500 Hv1 from a surface to a depth of between 25 and 50 µm.

7. The guiding member according to claim 1, characterised in that the surface layer has a hardness greater than or equal to 550 Hv1 from a surface to a depth of between 5 and 50 µm.

8. The guiding member according to claim 1, characterised in that the surface layer has a hardness greater than or equal to 550 Hv1 from a surface to a depth of between 25 and 50 µm.

9. A mechanical system, comprising a guiding member according to claim 1, and a mobile element arranged in the bore of said guiding member.

10. A method for producing a guiding member according to claim 1, characterised in that the method comprises the following successive steps:

producing the body from a ferrous metallic material having a yield strength Re of between 200 and 600 MPa;

carrying out a surface treatment of the bore in order to protect the guiding member against jamming, the surface treatment affecting a surface layer of the bore over a diffusion depth of less than or equal to 0.6 mm, the surface layer having, after the surface treatment, a hardness of greater than or equal to 550 Hv1 from a surface to a depth of between 5 and 50 µm.

* * * * *